United States Patent [19]

Kim et al.

[11] Patent Number: 5,712,600
[45] Date of Patent: Jan. 27, 1998

[54] ASTABLE MULTIVIBRATOR

[75] Inventors: Won-Kyum Kim, Suwon; Jang-Sik Won, Seoul, both of Rep. of Korea

[73] Assignee: Samsung Electronics Co., Ltd., Suwon, Rep. of Korea

[21] Appl. No.: 536,922

[22] Filed: Sep. 29, 1995

[30] Foreign Application Priority Data

| Sep. 29, 1994 | [KR] | Rep. of Korea | 24755/1994 |
| Oct. 13, 1994 | [KR] | Rep. of Korea | 26194/1994 |
| Dec. 16, 1994 | [KR] | Rep. of Korea | 34590/1994 |

[51] Int. Cl.⁶ ............................................. H03K 3/03
[52] U.S. Cl. ............... 331/113 R; 331/144; 331/DIG. 3; 331/108 C; 327/182; 327/261; 327/263
[58] Field of Search .................... 331/DIG. 3, 111, 331/143, 144, 113 R, 65, 108 C; 327/182, 172, 261, 263, 18, 38, 183, 185, 176, 131, 130, 136

[56] References Cited

U.S. PATENT DOCUMENTS

| 3,302,132 | 1/1967 | Karklys | 331/113 R |
| 3,517,339 | 6/1970 | Hubbard et al. | 331/113 R X |
| 3,568,086 | 3/1971 | Perry | 331/65 |
| 3,821,470 | 6/1974 | Merrell | 331/113 R X |
| 4,414,515 | 11/1983 | Suzuki et al. | 331/111 |
| 4,714,901 | 12/1987 | Jain et al. | 331/176 |

FOREIGN PATENT DOCUMENTS

| 0035566 | 3/1977 | Japan | 331/111 |

OTHER PUBLICATIONS

Electronic Design With Off-The-Shelf Integrated Circuits, 2nd Ed., Z. H. Meiksin and Philip C. Thackray, Prentice Hall, 1984 pp. 178-179.

*Primary Examiner*—Robert Pascal
*Assistant Examiner*—Arnold Kinkead
*Attorney, Agent, or Firm*—Cushman Darby & Cushman IP Group of Pillsbury Madison & Sutro LLP

[57] ABSTRACT

An astable multivibrator comprising a capacitor connected between a first output signal and a third output signal, an amplification circuit connected between the first and third output signals, a delay for delaying a signal logic-converted from the first output signal and for outputting a second output signal, and a variable resistor connected between the first output signal and an output node of the delay. High frequency oscillation performance is enhanced and a larger voltage operating range is obtained by excluding the effect of feedback current.

17 Claims, 6 Drawing Sheets

ASTABLE MULTIVIBRATOR

BACKGROUND OF THE INVENTION

1. Field of the Invention

The present invention relates to a high frequency oscillator, and more particularly to an astable multivibrator capable of enhancing high frequency oscillation performances.

2. Description of the Related Arts

Generally, astable multivibrators have been used as an oscillator in four bit or eight bit micro-computers and as a portable timekeeping device. In many applications such as, for example, the driving oscillator in DC—DC converter circuits, it is desirable to generate relatively high frequencies. For applications such as subscriber loop carrier systems in which cost, size and power consumption of the converter are of particular importance, it is also desirable to fabricate such oscillators in integrated circuit form. Present technology, however, dictates that integrated circuit oscillators be of the resistance-capacitance type since inductive elements cannot be fabricated in integrated form.

In the conventional astable multivibrator, the operating frequency thereof is determined by the resistors R and capacitors C, and most of the capacitors have a fixed capacitance value. In this case, if the capacitance is too small, the frequency oscillation can be distorted due to the effect of the parasitic capacitance. Thus, the capacitor should be fabricated in a size capable of minimizing the effect of the parasitic capacitance. If the capacitor is fabricated in a larger size in order to increase the capacitance thereof, this may cause an increase of the power consumption.

As described above, the integrated circuit oscillator formed from resistor-capacitor elements has a problem of deteriorating the high frequency oscillation performance due to the effect of the parasitic capacitance generated within the integrated circuit as well as the small feedback resistance to the input part.

Recently, Complementary Metal Oxide Semiconductor (CMOS) circuits have been mainly employed in the astable multivibrators. These CMOS circuits have a wide operating voltage and temperature range and a low temperature coefficient of the threshold voltage. This makes them ideal for forming astable multivibrators.

Figure 1:
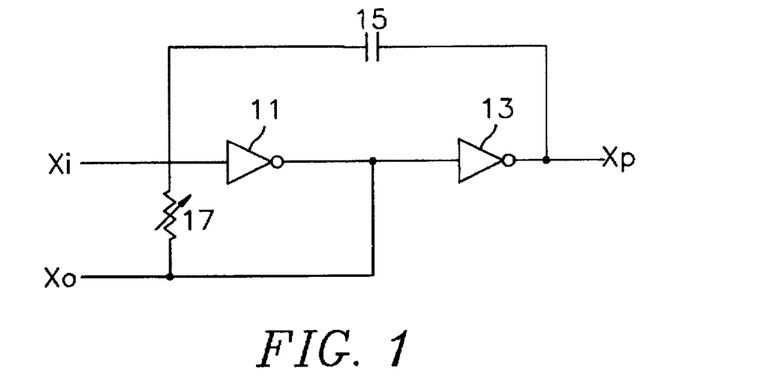
FIG. 1 is a circuit diagram illustrating a conventional astable multivibrator.

FIG. 1 shows a circuit construction of the conventional astable multivibrator. As shown in FIG. 1, a variable resistor 17 is connected between signal Xi and signal Xo. Signal Xi is connected to output signal Xp through first and second inverters 11 and 13. In addition, a capacitor 15 is connected between signals Xi and Xp, and the output of the first inverter 11 is coupled to the input of the second inverter 13 and signal Xo.

Figure 4:
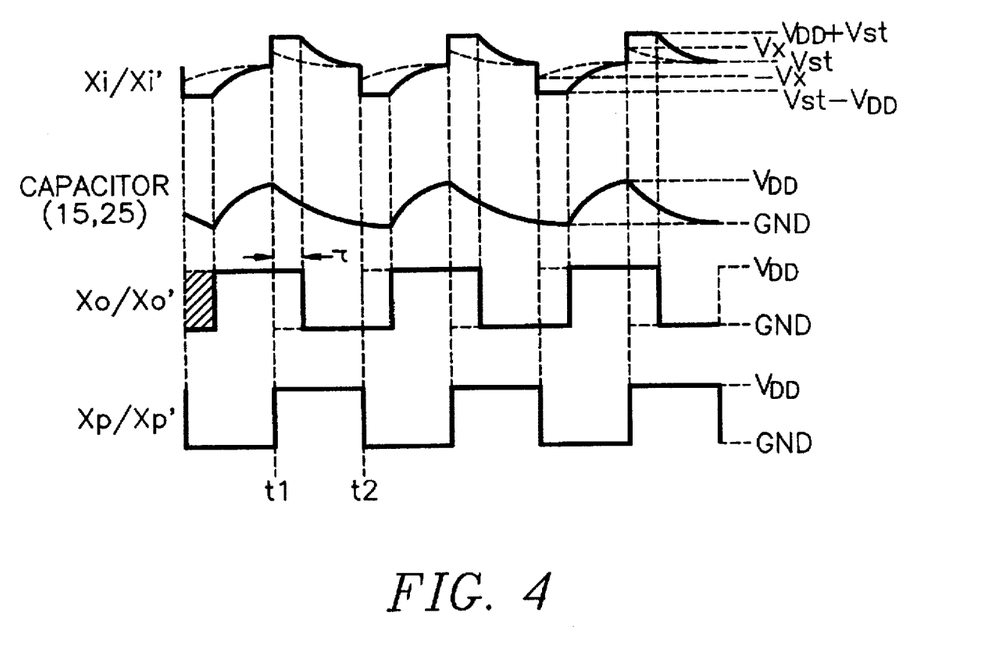
FIG. 4 is a voltage waveform diagram illustrating an operation state of the astable multivibrator of FIG. 2 as compared to that of FIG. 1.

The operation of the conventional astable multivibrator of FIG. 1 can be understood with reference to waveforms (a) to (d) shown in FIG. 4. In FIG. 4, the waveform (a) indicated by a dotted line is separated from that of the present invention.

When the supply voltage is applied to the circuit shown in FIG. 1, signal Xo has a CMOS logic level opposite to those of signals Xi and Xp. If the logic level of signal Xo is higher than the switching threshold voltage Vst of the first inverter 11, it becomes a logic "high" level, and otherwise, it becomes a logic "low" level. The first and second inverters 11 and 13 serve as amplifiers, and the voltage of signal Xi increases as signal Xo increases. When the voltage of signal Xi becomes higher than the switching threshold voltage Vst of the first inverter 11 at time t1, the output voltage of the first inverter 11 becomes the logic "low" level and the output voltage of the second inverter 13 becomes the logic "high" level. Thus, at time t1, signals Xo and Xp have the logic "low" and "high" levels, respectively. At this time, the voltage level of signal Xi is rapidly increased by the feedback operation of the capacitor 15 until the third output signal Xp reaches the power supply voltage level VDD. Such a feedback operation is repeated for a few nanoseconds.

After signal Xp reaches the power supply voltage level VDD, as signal Xo is in the logic "low" level, the voltage of signal Xi begins to decrease through the variable resistor 17. If the voltage of signal Xi drops below the switching threshold voltage Vst of the first inverter 11, the output voltage of the first inverter 11 goes to the logic "high" level, and the output voltage of the second inverter 13 goes to the logic "low" level. Consequently, the voltage of signal Xi is lowered through capacitor 15 by signal Xp at a logic "low" level. At this time, signal Xo of logic "high" level increases the voltage of signal Xi through the variable resistor 17 from the time t2.

The variable resistor 17 serves as a factor determining how fast signal Xi which is affected by the voltage level of signal Xo swings from the logic "high" level to the logic "low" level or from the logic "low" level to the logic "high" level. That is, the variable resistor 17 determines the charge-discharge time of the capacitor 15, and consequently becomes the factor for specifying the high frequency oscillation cycle of the astable multivibrator. In order to obtain a faster signal Xi as necessary to obtain a high frequency, the resistance value of the variable resistor 17 should be small within a predetermined range. In addition, signal Xi should have a desirable voltage operating range VDD+Vst to Vst−VDD.

However, as indicated by the dotted line of waveform (a) of signal Xi shown in FIG. 4, if the resistance value of the variable resistor 17 is low, the charge or discharge operation to the capacitor 15 begins at Vx or −Vx, i.e., before the first output signal Xi reaches VDD+Vst or Vst−VDD. That is, signal Xi does not have the voltage operating range of VDD+Vst to Vst−VDD. On the contrary, when making the resistance value of the variable resistor 17 high enough the above described problem of narrow voltage operating range, a problem of deteriorating the high frequency oscillation performance.

SUMMARY OF THE INVENTION

It is therefore an object of the present invention to provide an astable multivibrator capable of generating a high frequency output signal having a stable and wide voltage operating range even though the resistance value determining the charge-discharge time of a capacitor is small.

To achieve the above object, an astable multivibrator according to a preferred embodiment of the present invention comprises a capacitor (capacitor means) connected between a first output signal and a third output signal, an amplifier (amplification means) connected between the first output signal and the third output signal, delay means for delaying a signal logic level converted from the first output signal and outputting a second output signal, and a variable resistor (variable resistor means) connected between the first output signal and an output node of the delay means.

In order to accomplish the above object, an astable multivibrator according to another preferred embodiment of the present invention comprises a plurality of amplification means serially connected between a first output signal and a third output signal, capacitor means connected in parallel with the amplification means, edge detection means for detecting the level variation of a second output signal which has passed through one of the amplification means, and a switch (switching means) for switching the connection state of a resistor (resistor means) connected between the first output signal and the second output signal in response to the output signal of the edge detection means.

BRIEF DESCRIPTION OF THE DRAWINGS

In the detailed description of the preferred embodiments of the present invention presented below, reference is made to the accompanying drawings, in which.

DETAILED DESCRIPTION OF THE PREFERRED EMBODIMENT

Figure 2:
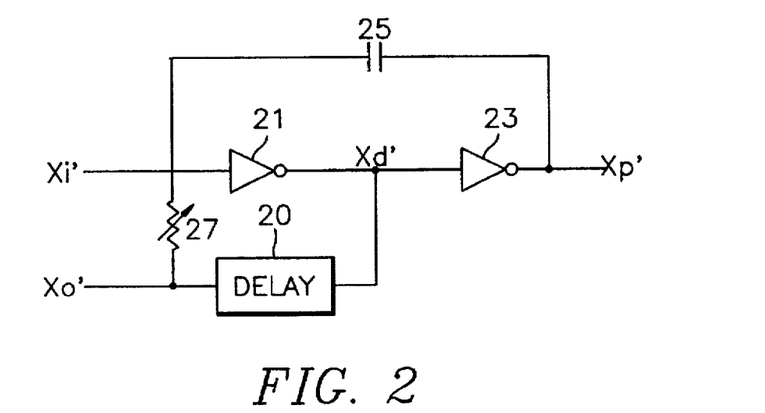
FIG. 2 is a circuit diagram illustrating an astable multivibrator according to a preferred embodiment of the present invention.

Referring to FIG. 2, a variable resistor 27 is connected between a first output signal Xi' and a second output signal Xo'. First and second inverters 21 and 23 are serially connected between the first output signal Xi' and a third output signal Xp', and a capacitor 25 is connected between the first and third output signals Xi' and Xp' and in parallel with the first and second inverters 21 and 23. A CMOS type capacitor is employed herein for the capacitor 25. A delay 20 for delaying an output signal Xd' of the first inverter 21 for a predetermined time τ is connected between the output of the first inverter 21 and the second output signal Xo'. The delay 20 can be fabricated by serially connecting even numbers of inverters corresponding to the required delay time τ.

Figure 3:
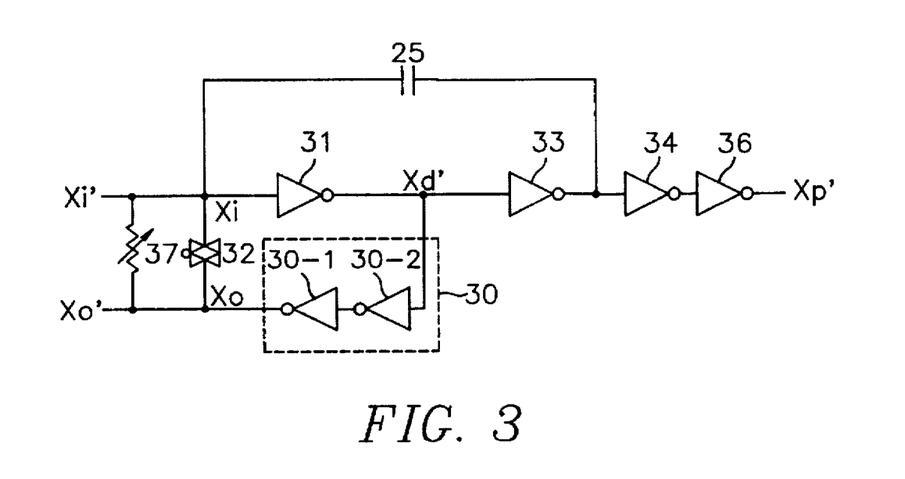
FIG. 3 is a detailed circuit diagram of the astable multivibrator of FIG. 2.

The present invention can also be implemented with a CMOS transmission gate 32 used as an internal resistor between the first and second output signals Xi' and Xo' as shown in FIG. 3. As the length of the transmission gate is much larger than the width thereof, the transmission gate 32 has a negligible an ignorable resistance value, and such was not illustrated in FIG. 2. In addition, buffers 34 and 36 are coupled to a node connected to the output of the second inverter 33 and to one node of the capacitor 25 can also be employed for shaping the third output signal Xp'.

The operation of the astable multivibrator according to the present invention will now be described with reference to FIG. 4. If the supply voltage is applied to the circuit, the first, second and third output signals Xi', Xo' and Xp' respectively maintain logic "low", "high" and "low" levels at power-up. In this case, the second output signal Xo' goes to the logic "high" level after the lapse of the delay time τ from the application of the supply voltage.

The voltage of the first output signal Xi' begins to increase by the second output signal Xo' of logic "high" level. If the voltage of the first output signal Xi' increases above the switching threshold voltage Vst of the first inverter 21 or 31, the output signal Xd' of the first inverter 21 or 31 becomes the logic "low" level and the output voltage of the second inverter 23 or 33, that is, the voltage of the third output signal Xp' becomes the logic "high" level. The output signal Xd' of logic "low" level is time-delayed by τ through the delay 20 or 30, and then is output as the second output signal Xo'. That is, as shown in waveform (c) of FIG. 4, right after the lapse of the delay time τ from the time t1, the second output signal Xo' goes to the logic "low" level. Thus, as shown in waveform (a) during this delay time τ, the voltage of the first output signal Xi' acceleratedly increases to the level of VDD+Vst in response to the increase of the voltage level of the third output signal Xp' whereas in the prior art circuit of FIG. 1, the voltage of the first output signal Xi begins to drop before reaching the level of VDD+Vst.

The voltage of the first output signal Xi' begins to drop with the transition of the second output signal Xo' to the logic "low" level. If the voltage of the first output signal Xi' decreases below the switching threshold voltage Vst of the first inverter 21 or 31, the output signal Xd' of the first inverter 21 or 31 becomes the logic "high" level and the third output signal Xp' becomes the logic "low" level. The second output signal Xo' goes to the logic "high" level after the lapse of the delay time τ from the time t2. Thus, during this delay time τ, the voltage of the first output signal Xi' acceleratedly decreases to the level of Vst−VDD in response to the voltage drop of the third output signal Xp'.

As described above, the delay time τ ensures that the high frequency output signal Xi' has the voltage operating range of VDD +Vst to Vst−VDD, thus solving the problem of the conventional circuit of FIG. 1 wherein the first output signal Xi does not have as wide a voltage operating range as is required in a typical application. Therefore, it is possible to ensure a desired voltage operating range even though the resistance value of the resistor 27 or 37 is much smaller than is conventionally used so as to make the high frequency oscillation cycle faster.

Referring to the following table 1 comparing the result of a simulation of the conventional circuit of FIG. 1 with that of the circuit of FIG. 3 of the present invention, for example, in the case that the resistance value of 1.4KΩ is used under the condition of 25° C., the first output signal Xi in the conventional circuit has a voltage of 3.799V corresponding to the Vx level in waveform (a) of FIG. 4, and a frequency of 31.7 MHz, whereas the first output signal Xi' in the present invention has a voltage of 5.637V corresponding to the VDD +Vst level and a higher frequency of 35.9 MHz. Furthermore, in the case that the resistance value of the variable resistor is below 1.1KΩ, no vibration occurs at all in the conventional circuit, whereas the first output signal Xi' according to the circuit of the present invention vibrates at the voltage and frequency shown in table 1.

TABLE 1

|  |  | 100 KΩ | 50 KΩ | 10 KΩ | 4 KΩ | 2 KΩ | 1.7 KΩ | 1.4 KΩ | 1.1 KΩ | 0 KΩ |
| --- | --- | --- | --- | --- | --- | --- | --- | --- | --- | --- |
| FIG. 1 (prior art) | Xi[V] | 5.637 | 5.635 | 5.618 | 5.322 | 4.490 | 4.189 | 3.799 | No Vibration | No Vibration |
|  | [MHz] | 1.6 | 3.0 | 11.4 | 21.7 | 29.7 | 31.5 | 31.7 | No Vibration | No Vibration |
| FIG. 3 (invention) | Xi'[V] | 5.646 | 5.644 | 5.642 | 5.640 | 5.639 | 5.638 | 5.637 | 5.635 | 5.595 |
|  | [MHZ] | 1.7 | 3.1 | 11.6 | 21.7 | 31.2 | 33.3 | 35.9 | 38.5 | 53.0 |

Figure 5:
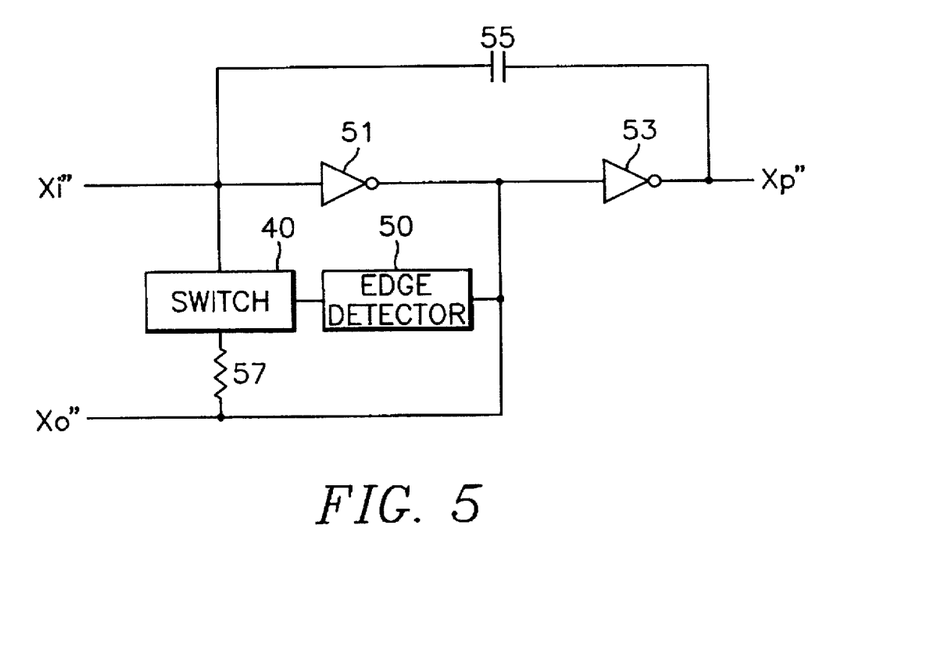
FIG. 5 is a circuit diagram illustrating an astable multivibrator according to another preferred embodiment of the present invention.
Figure 6:
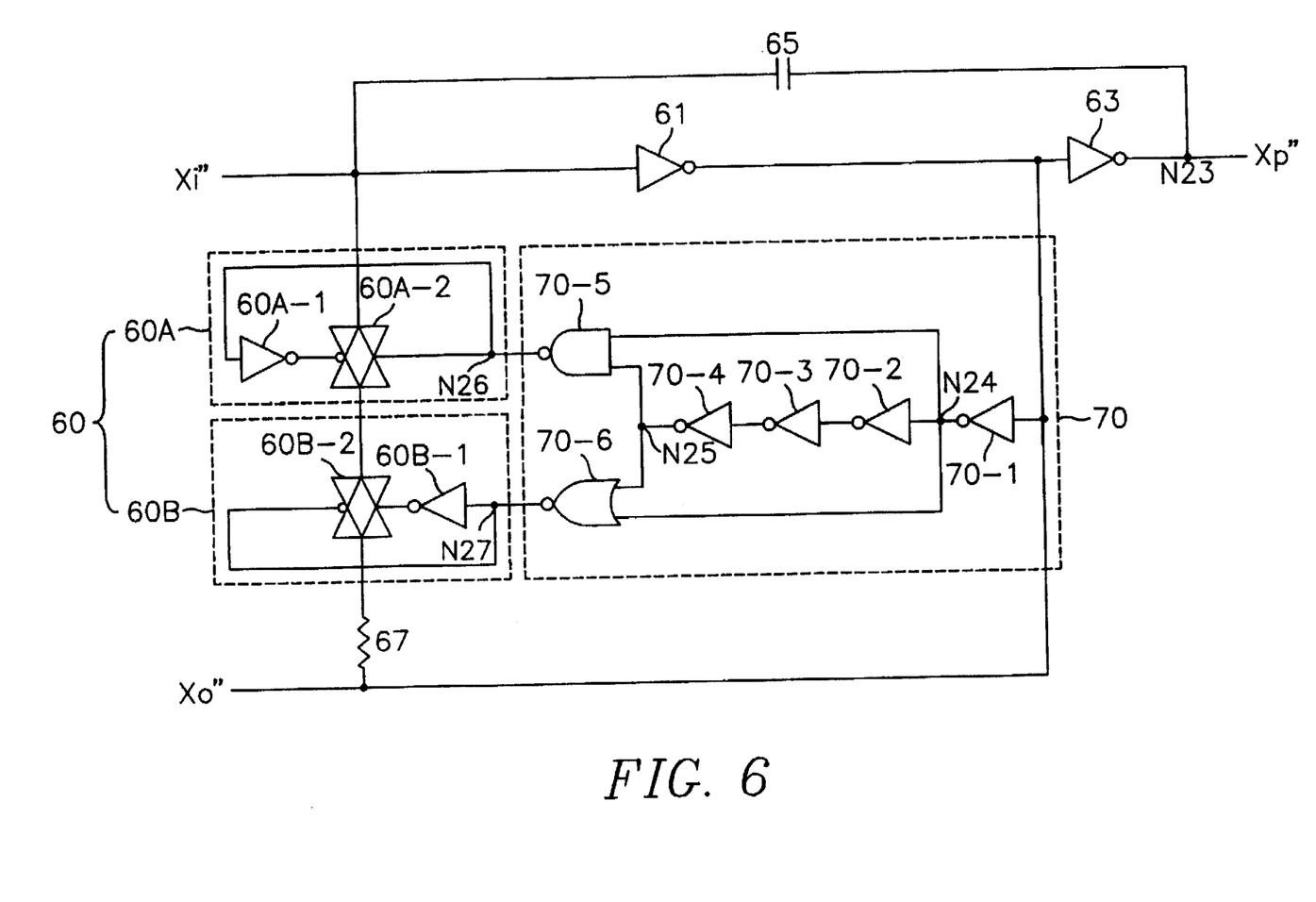
FIG. 6 is a detailed circuit diagram of the astable multivibrator of FIG. 5.
Figure 7:
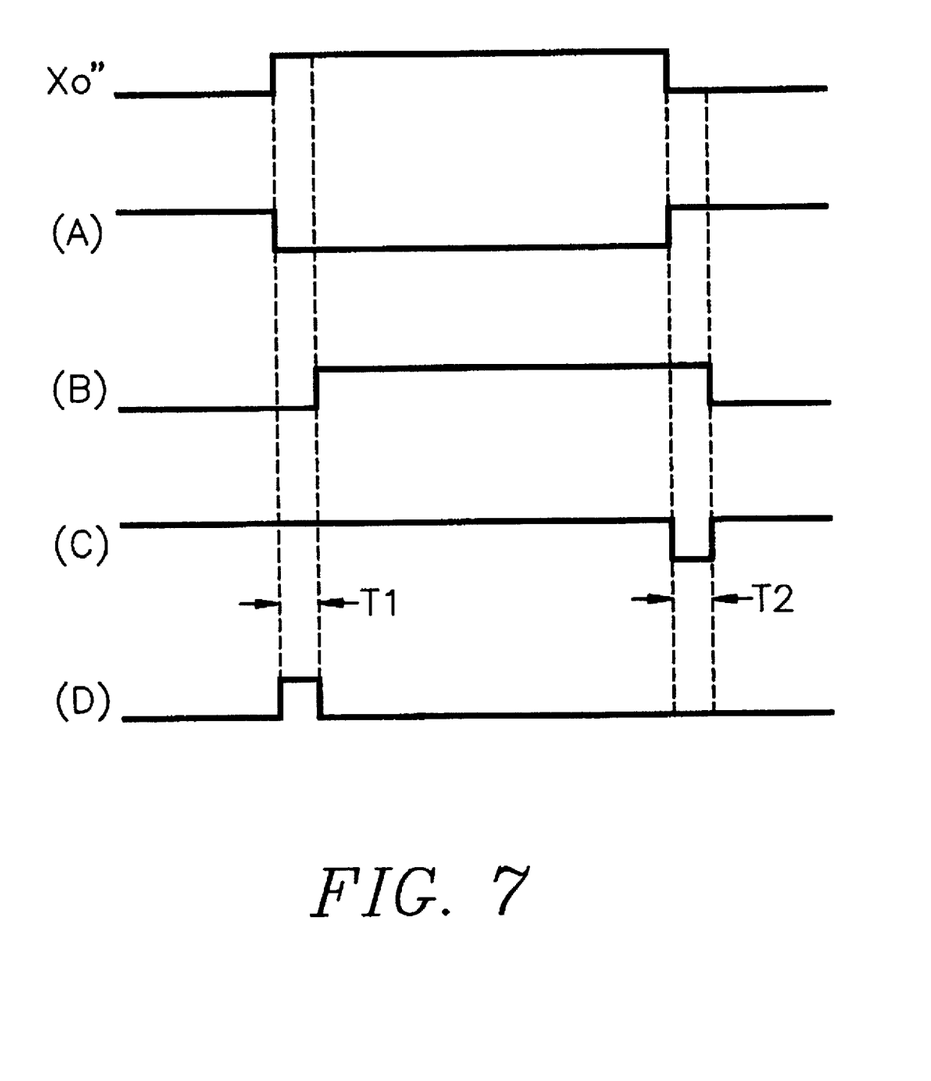
FIG. 7 is a voltage waveform diagram of each node in an edge detector of the astable multivibrator of FIG. 6.

FIG. 5 is a circuit diagram showing the astable multivibrator according to another embodiment of the present invention, and FIG. 6 is a detailed circuit diagram of the astable multivibrator of FIG. 5. FIG. 7 shows a voltage waveform diagram of each node in the edge detector of the astable multivibrator according to the present invention.

The construction and operation of this embodiment of the present invention will now be described with reference to FIGS. 5 to 7.

Referring more particularly to FIG. 5, the astable multivibrator according to this embodiment comprises a plurality of amplifiers 51 and 53 connected between a first output signal Xi" and a third output signal Xp", a capacitor 55 connected between the first and third output signals Xi" and Xp" and in parallel with the amplifiers 51 and 53, an edge detector 50 connected to a second output signal Xo", for detecting a variation of the voltage level of the second output signal Xo" which has passed through the amplifier 51, and a switch 40 and a resistor 57 connected in series between the first output signal Xi" and the second output signal Xo". Switch 40 switches the connection state between the first output signal Xi" and the resistor 57 in response to an output signal of the edge detector 50.

In FIG. 6, first and second inverters 61 and 63 are serially connected between a first signal node and a third signal node, and a capacitor 65 is connected in parallel with the first and second inverters 61 and 63. An edge detector 70 detects the first and second edge pulses of a second output signal Xo" output from a connection node between the first and second inverters 61 and 63. A resistor 67 is connected to an input node of the edge detector 70 at its one end. A switch 60 is connected between the first signal node and the other end of the resistor 67, and isolates the path therebetween during the reception of first and second edge detection pulses from the edge detector 70.

The edge detector 70 comprises a square wave generator composed of a third inverter 70-1, delay means composed of fourth, fifth and sixth inverters 70-2, 70-3 and 70-4 serially connected to one another to delay the output of the square wave generator for a predetermined time, and a NAND gate 70-5 for NANDing the output of the third inverter 70-1 with the output of the delay means. NAND gate 70-5 outputs a first edge detection pulse, i.e., the rising edge pulse, and a NOR gate 70-6 NORs the output of the third inverter 70-1 with the output of the delay means and outputs a second edge detection pulse, i.e., the falling edge pulse.

The switch 60 comprises first and second transmission gates 60A and 60B which are respectively switched on in response to the first and second edge detection pulses output from the NAND gate 70-5 and the NOR gate 70-6. In FIG. 6, 60A-2 and 60B-2 are typical transmission gates, each composed of an NMOS transistor and a PMOS transistor. Inverters 60A-1 and 60B-1 invert the first and second edge detection pulses and drive the control electrodes of the PMOS transistors in the transmission gates 60A-2 and 60B-2.

Referring to FIG. 7, the operation of opening/isolating the connection between the first output signal Xi" and the resistor 67 in response to the output of the edge detector 70 will now be described. If the second output signal Xo" is applied to the third inverter 70-1, an inverted signal is output to a node N24 shown in FIG. 6 and as shown by waveform (A) of FIG. 7. The obtained signal is inverted and delayed for a predetermined time T1 through the fourth, fifth and sixth inverters 70-2, 70-3 and 70-4 as shown in waveform (B) of FIG. 7 and then is output to a node N25 shown in FIG. 6. The outputs of the nodes N24 and N25 are commonly applied to the NAND gate 70-5 and to the NOR gate 70-6, which then respectfully produce the signals as shown in waveforms (C) and (D) of FIG. 7, which are then respectively output to nodes N26 and N27, shown in FIG. 6.

The NMOS gate electrode of the first transmission gate 60A is coupled to the output line of the NAND gate 70-5 and the PMOS gate electrode thereof to the output of the NAND gate 70-5 through a seventh inverter 60A-1, whereby the first transmission gate 60A is turned on when the output signal of the NAND gate 70-5 is in the logic "high" level. The NMOS gate electrode of the second transmission gate 60B is coupled to the output of the NOR gate 70-6 through an eighth inverter 60B-1 and the PMOS gate electrode thereof to the output line of the NOR gate 70-6, whereby the second transmission gate 60B is turned on when the output signal of the NOR gate 70-6 is in the logic "low" level. During the delay time T1, the transmission gate 60B is turned off, and during the delay time T2, the first transmission gate 60A is turned off. Thus, the effect of the resistance value of the resistor 67 which is to be fed back to the first output signal Xi" is eliminated. Therefore, the input signal swings sufficiently to the logic "high" level or to the logic "low" level outputting the third output signal Xp" of high frequency with a correct cycle.

In the case that the first output signal Xi" is changed from the logic "high" level to the logic "low" level, such a change is detected by the edge detector 70. Switch 60 isolates the effect of the feedback resistance from the first inverter 61 to the first output signal Xi", whereby the second output signal Xo" passed through the first inverter 61 becomes the logic "high" level and the third output signal Xp" becomes the logic "low" level. This results from the sufficient amplification provided by the first and second inverters 61 and 63. With the transition of the third output signal Xp" to the logic "low" level, the first output signal Xi" drops to the logic "low" level through the capacitor 65. Through the first and second inverters 61 and 63, the first output signal Xi" of logic "low" level affects the third output signal Xp" so as to be dropped much more to the logic "low" level. Such a step will be repeated until the third output signal Xp" becomes 0V. After the third output signal Xp" becomes 0V, the first output signal Xi" remains at a logic "low" level while the switch 60 is turned off by the edge detector 70. After the lapse of a predetermined delay time by the edge detector 70, the switch 60 is turned on, and the capacitor 65 is charged by the feedback current passing through the resistor 67 in response to the level variation of the second output signal Xo" which has passed through the first inverter 61. The moment the first output signal Xi" exceeds the switching threshold voltage Vst, the edge detector 70 detects the level variation of the second output signal Xo" which has passed through the first inverter 61, and the switch 60 is thereby turned off. At this time, the first output signal Xi" becomes higher than the switching threshold voltage by the first inverter 61, switch 60 and edge detector 70.

Such a small variation of the first output signal Xi" is amplified through the first and second inverters 61 and 63 and affects the third output signal Xp". By this variation of the third output signal Xp", the first output signal Xi" is varied again through the capacitor 65 as much as the variation of the third output signal Xp". Such an operation is repeated until the third output signal Xp" reaches the VDD level. After the third output signal Xp" reaches the VDD level, the first output signal Xi" maintains the logic "high" level for the time delayed by the edge detector 70. In addition, after the lapse of a predetermined delay time by the edge detector 70, the switch 60 is turned on again, and the step of discharging the potential of the first output signal Xi" from the capacitor 65 is repeated.

Figure 8:
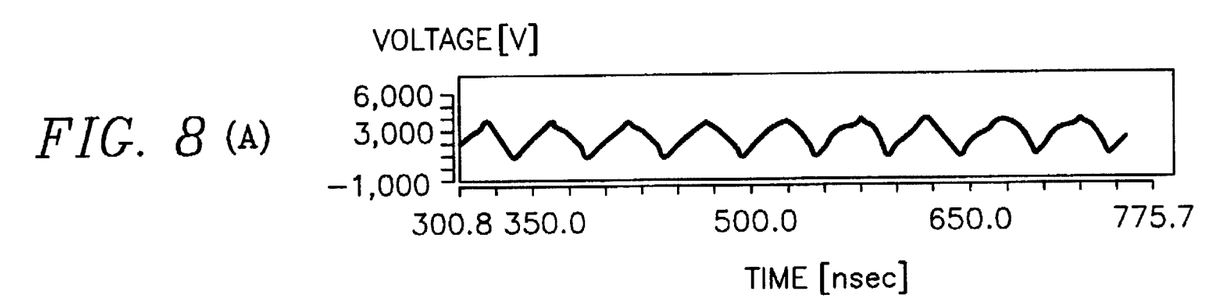
FIGS. 8(A) to 8(C) are voltage waveform diagrams according to a result of a simulation using a conventional circuit.

FIG. 8 is a voltage waveform diagram according to the result of the simulation using the conventional circuit. FIG. 8 shows waveforms (A), (B) and (C) of the first, second and third output signals Xi, Xo, and Xp, respectively. As can be seen from FIG. 8, the first output signal Xi does not have sufficient amplitude because of the effect of the feedback resistance from the second output signal Xo. This results in the generation of a high frequency waveform with an incorrect cycle.

Figure 9:
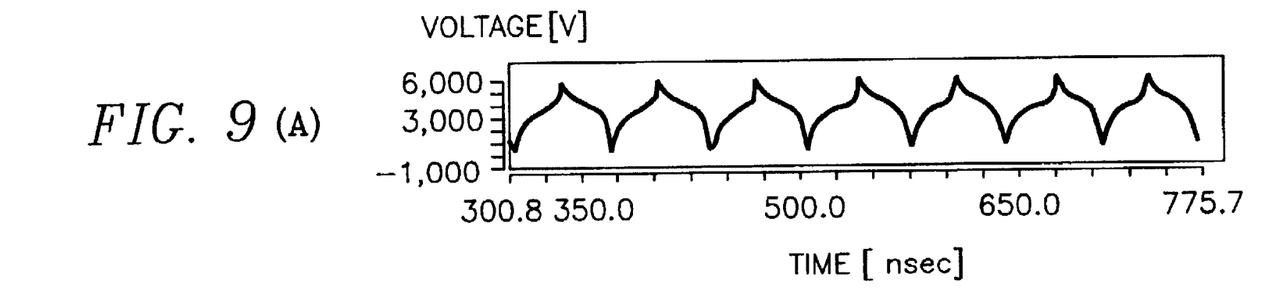
FIGS. 9(A) to 9(C) are voltage waveform diagrams according to the result of the simulation using the present invention.

FIG. 9 is a voltage waveform diagram according to the result of a simulation of the astable multivibrator of the present invention. In FIG. 9, waveforms (A), (B) and (C) show the first, second and third output signals Xi", Xo", and Xp", respectively. As compared to FIG. 8, the first output signal Xi" of the circuit of the present invention has sufficient amplitude because it is isolated from the effect of the feedback resistance from the output signal of the first inverter. This results in the generation of a higher frequency waveform with correct cycle.

As described above, a major advantage of the astable multivibrator according to the present invention is its ability to enhance the high frequency oscillation performance and to generate high frequency output signals having a larger and more desirable voltage operating range. In addition, the astable multivibrator according to the present invention is capable of obtaining high frequency output waveforms with correct cycles by excluding the effect of the feedback current, thus enhancing the oscillation performance and reliability of the astable multivibrator.

Those skilled in the art will appreciate that the present invention may be embodied in other specific forms without departing from the spirit or scope of the invention.

What is claimed is:

1. An astable multivibrator comprising:
capacitor means connected between a first signal and a third signal;
amplification means connected between said first signal and said third signal;
delay means for delaying a second signal, said second signal being an inversion of said first signal, said delay means comprising an even number of inverters connected serially; and
variable resistor means connected between said first signal and said delayed second signal.

2. The astable multivibrator according to claim 1, wherein said amplification means comprises:
a first inverter having an input terminal connected to said first signal; and
a second inverter having an input terminal connected to an output of said first inverter and having an output terminal providing said third signal.

3. The astable multivibrator according to claim 2, wherein:
said second signal is generated from said output terminal of said first inverter.

4. The astable multivibrator according to claim 2, further comprising:
buffer means connected between said third signal and a node coupled to both said output terminal of said second inverter and to said capacitor means.

5. The astable multivibrator according to claim 1, wherein:
said astable multivibrator is formed within a single integrated circuit.

6. An astable multivibrator comprising:
capacitor means connected between a first signal and a third signal;
amplification means connected between said first signal and said third signal;
delay means for delaying a second signal, said second signal being an inversion of said first signal;
variable resistor means connected between said first signal and said delayed second signal; and
a transmission gate connected between said first signal and said second signal, a length of said transmission gate being at least ten times greater than a width of said transmission gate.

7. The astable multivibrator according to claim 6, further comprising:
buffer means connected between said third signal and a node coupled to both an output terminal of said amplification means and to said capacitor means.

8. An astable multivibrator comprising:
a plurality of amplification means connected serially between a first signal and a third signal;
capacitor means connected in parallel with said plurality of amplification means between said first signal and said third signal;
edge detection means for detecting a level variation of a second signal which has passed through one of said plurality of amplification means;
resistor means connected to said second signal; and
switching means for switching a connection state of said resistor means between said second signal and said first signal in response to an output signal of said edge detection means.

9. The astable multivibrator according to claim 8, wherein said plurality of amplification means comprises:
a first inverter having an input terminal receiving said first signal; and
a second inverter having an input terminal connected to an output terminal of said first inverter and having an output terminal connected to said third signal.

10. The astable multivibrator according to claim 9, wherein said edge detection means comprises:
square wave generation means for shaping an output signal of said first inverter into a square wave;

a plurality of delay means for delaying said output signal of said first inverter for a predetermined time; and a NAND gate and a NOR gate for receiving respective output signals of said square wave generation means and said delay means.

11. The astable multivibrator according to claim 10, wherein said delay means comprises:

an odd number of inverters.

12. The astable multivibrator according to claim 10, wherein said square wave generation means comprises:

at least one inverter.

13. The astable multivibrator according to claim 8, wherein said switching means comprises:

a plurality of transmission gates serially connected to one another, each of said plurality of transmission gates comprising:
an NMOS transistor, and
a PMOS transistor.

14. An astable multivibrator according to claim 8, wherein:

said astable multivibrator is formed within a single integrated circuit.

15. An astable multivibrator comprising:

a first inverter and a second inverter connected serially between a first signal node and a third signal node;

edge detection means comprising:
wave shaping means for shaping a second output signal output from a connection node between said first inverter and said second inverter into a square wave;
delay means for delaying an output of said wave shaping means for a predetermined time;
a first edge detector for comparing an output of said wave shaping means with an output of said delay means, and for detecting a first edge state; and
a second edge detector for comparing said output of said wave shaping means with said output of said delay means, and for detecting a second edge state;

resistor means having one end connected to an input node of said edge detection means; and switching means having first and second transmission gates connected serially between said first signal node and the other end of said resistor means, said switching means isolating a path between said first signal node and said other end of said resistor means during reception of first and second edge detection pulses from said first edge detector and said second edge detector, respectively.

16. An astable multivibrator according to claim 15, wherein:

said astable multivibrator is formed within a single integrated circuit.

17. An astable multivibrator comprising:

a plurality of amplifiers connected serially between a first signal and a third signal;

a capacitor connected in parallel with said plurality of amplifiers between said first signal and said third signal;

an edge detector to detect a level variation of a second signal which has passed through one of said plurality of amplifiers;

a resistor connected to said second signal; and a switch to switch a connection state of said resistor between said second signal and said first signal in response to an output signal of said edge detector.

* * * * *